United States Patent
Tsai et al.

(10) Patent No.: US 7,314,838 B2
(45) Date of Patent: Jan. 1, 2008

(54) METHOD FOR FORMING A HIGH DENSITY DIELECTRIC FILM BY CHEMICAL VAPOR DEPOSITION

(75) Inventors: Cheng-Yuan Tsai, Hsin-Chu (TW); Chih-Lung Lin, Taipei (TW); You-Hua Chou, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 215 days.

(21) Appl. No.: 11/186,353

(22) Filed: Jul. 21, 2005

(65) Prior Publication Data

US 2007/0020953 A1    Jan. 25, 2007

(51) Int. Cl.
*H01L 21/00* (2006.01)
(52) U.S. Cl. .............................. 438/798; 257/E21.269; 257/E21.563
(58) Field of Classification Search ................ 438/795, 438/798; 257/E21.091, E21.269, E21.563
See application file for complete search history.

(56) References Cited

U.S. PATENT DOCUMENTS 6,713,873 B1 *   3/2004   O'Loughlin et al. ......... 257/758
2005/0235905 A1 * 10/2005   Senzaki et al. ............... 117/88

* cited by examiner

*Primary Examiner*—W. David Coleman
(74) *Attorney, Agent, or Firm*—Thomas, Kayden, Horstemeyer & Risley (57) ABSTRACT

A method for forming a high density dielectric film by chemical vapor deposition. The method comprises: (a) a substrate is provided in a processing chamber; (b) a first gas is introduced into the processing chamber with a first pressure and adsorbed on the substrate, wherein the first gas comprises silicon-containing or carbon-containing gas; (c) the first gas is stopped, and the first pressure is lowered to a second pressure; (d) a second gas is introduced into the processing chamber with a third pressure, and forced to react with the first gas absorbed on the substrate and remained in the processing chamber, wherein the second gas comprises oxidizer or reduction agent; (e) the steps (b)~(d) are repeated until a high density dielectric film is formed on the substrate.

27 Claims, 7 Drawing Sheets

METHOD FOR FORMING A HIGH DENSITY DIELECTRIC FILM BY CHEMICAL VAPOR DEPOSITION

BACKGROUND

The present invention relates a method for forming a dielectric film in general. More particularly, it relates to a method for forming a high density dielectric film by chemical vapor deposition.

Conventional semiconductor devices comprise a semiconductor substrate, a plurality of inter-metal dielectric (IMD) layers and conductive patterns. The conductive patterns comprise conductive lines separated by the inter-metal dielectric layers, and a plurality of interconnect lines, such as bus lines, bit lines, word lines and logic interconnect lines. Furthermore, the conductive patterns on different layers are electrically connected by a conductive plug filling a via hole.

Aluminum and aluminum alloys have been the most widely used interconnection metallurgies for integrated circuits. It has become increasingly important, however, that metal conductors forming interconnections between devices as well as between circuits in a semiconductor have low resistivity for faster signal propagation. Copper is preferred for its low resistivity as well as for resistance to electromigration (EM) and stress voiding properties for very and ultra large scale integrated (VLSI and ULSI) circuits.

In conventional metal interconnect methodology, inter-metal dielectric layers must be subsequently formed on the conductive patterns serving as capping layer on the exposed surface of the conductive patterns (such Cu, Al, or alloy thereof). The inter-metal dielectric layers, such as silicon nitride, however, deposited by conventional plasma enhanced chemical vapor deposition (PECVD), exhibit poor adhesion to the conductive patterns surface. Consequently, the inter-metal dielectric layer is vulnerable to removal, as by peeling due to scratching or stresses resulting from subsequent deposition of layers. As a result, the conductive pattern, for example a Cu interconnect member, is not entirely encapsulated resulting in diffusion adversely affecting device performance and decreasing the electromigration resistance of the Cu interconnect member. Moreover, conventional PECVD dielectric layers have a density of about 2.62 g/cm$^3$ and, hence, are not particularly effective as an etch stop layer during formation of interconnects for subsequent metallization levels.

As design rules extend deeper into the submicron range, e.g., to about 0.18 micron and under, the reliability of interconnect pattern becomes particularly critical. The adhesion of IMD layers to metal interconnects and the accuracy of interconnects for vertical metallization levels require even greater reliability. Thus, a method for forming a high density dielectric film with improved adhesion is desirable.

SUMMARY

Accordingly, a method for forming a high density dielectric film by chemical vapor deposition is provided. In exemplary embodiments of the method comprise the following steps: (a) a substrate is provided in a processing chamber; (b) a first gas is introduced into the processing chamber with a first pressure and adsorbed on the substrate, wherein the first gas comprises silicon-containing or carbon-containing gas; (c) introduction of the first gas is stopped, and the first pressure is lowered to a second pressure, remaining a part of the first gas in the process chamber; (d) a second gas is introduced into the processing chamber with a third pressure, and forced to react with the first gas absorbed on the substrate and the first gas remaining in the processing chamber, wherein the second gas comprises oxidizer or reduction agent; (e) the steps (b)~(d) are repeated until a high density dielectric film is formed on the substrate.

Further provided is a method for fabricating a semiconductor device, comprising the following steps: (a) a substrate is provided in a processing chamber; (b) a first gas is introduced into the processing chamber with a first pressure and adsorbed on the substrate, wherein the first gas comprises silicon-containing or carbon-containing gas, (c) introduction of the first gas is stopped, and the first pressure is lowered to a second pressure, remaining a part of the first gas in the process chamber; (d) a second gas is introduced into the processing chamber with a third pressure, and forced to react with the first gas absorbed on the substrate and the first gas remaining in the processing chamber, wherein the second gas comprises oxidizer or reduction agent; (e) the steps (b)~(d) are repeated until a first high density dielectric film is formed on the substrate; (f) the first gas and second gas are simultaneously introduced into the processing chamber with a fourth pressure of more than 3 Torr, and forced to react each other to form a low-k dielectric layer on the first high density dielectric film.

After the step (f), the method for fabricating a semiconductor device may further comprise the following steps: (g) The first gas is introduced into the processing chamber with a fifth pressure and adsorbed on the first high density dielectric film; (h) introduction of the first gas is stopped, and the fifth pressure is lowered to a sixth pressure; (i) the second gas is introduced into the processing chamber with a third pressure, and forced to react with the first gas absorbed on the substrate and remained in the processing chamber; (j) the steps (g)~(i) are repeated until a second high density dielectric film is formed on the low-k dielectric layer.

A detailed description is given in the following embodiments with reference to the accompanying drawings.

BRIEF DESCRIPTION OF THE DRAWINGS

The invention can be more fully understood by reading the subsequent detailed description in conjunction with the examples and references made to the accompanying drawings, wherein.

DESCRIPTION

A method for forming a dielectric film by chemical vapor deposition under designated reaction conditions, wherein the dielectric film is not more than 100 nm thick, is provided. Specifically, the pressure of the processing chamber, the amount of flowing reactive gases, and the plasma RF power are modified optionally with reaction time. Therefore, dielectric films having high density (more than 3.5 g/cm$^3$) and improved adhesion with adjacent layers can be obtained by the above method.

An exemplary embodiment of the method for forming a high density dielectric film by chemical vapor deposition is described as following.

Figure 1:
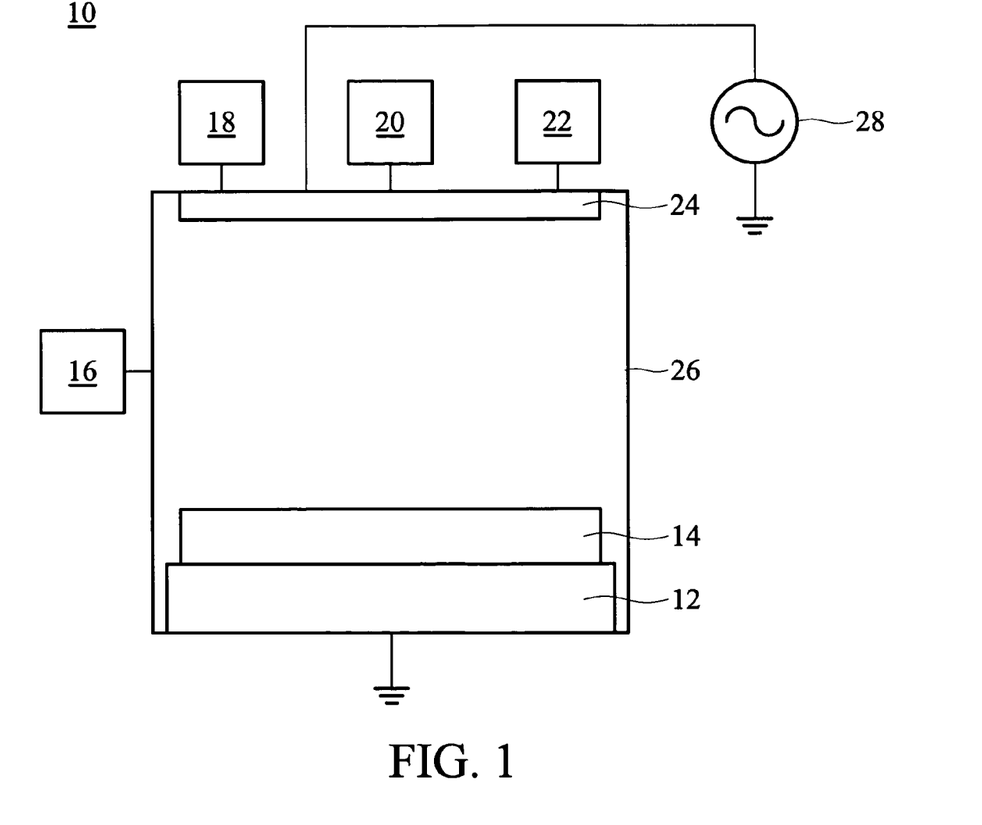
FIG. 1 is a schematic view of a plasma processing system employed in the invention.

As shown in FIG. 1, a plasma processing system 10 is provided. The plasma processing system 10 includes a plasma processing chamber 26 wherein a gas injection plate 24 is positioned directly opposite a substrate holder 12. The substrate holder may have a heater therein to raise temperature of a substrate 14 disposed thereon. The gas injection plate 24 is connected to a first gas supply 18 and a second gas supply 20 to facilitate gas injections. Further, the gas injection plate 24 can be connected to a carrier gas supply 22 to introduce carrier gas mixed with the first or second gas flow. The plasma processing system 10 further includes a vacuum pump system 16 through which process gases and effluent gases can be removed (or evacuated) from the processing chamber 26. Vacuum pump system 16 preferably includes a turbo-molecular vacuum pump. (TMP) capable of a pumping speed up to 5000 liters per second (and greater) and a gate valve for throttling the chamber pressure.

A substrate 14 is then transferred into the processing chamber 26 for placement on the substrate holder 12, referring to FIG. 1. The substrate 14 can be heated to a desired deposition temperature of 100~400° C., preferably 150~350° C., via the substrate holder 12. Herein, use of the term substrate includes devices formed within a semiconductor wafer and the layers overlying the wafer.

Next, a first gas flow 30 supplied by the first gas supply 18 is introduced into the processing chamber 26 over the substrate 14 at a first pressure not more than 3 Torr, preferably between 1 Torr to 0.1 mTorr. The first gas comprises silicon-containing or carbon-containing gas, such as SiH$_4$, Si$_2$H$_6$, SiH$_3$CH$_3$, TEOS, TMCTS, OMCTS, methyl-silane, dimethyl-silane, 3MS, 4MS, TMDSO, TMDDSO, DMDMS or combinations thereof. Please refer to FIG. 2a, which depicts the step of adsorption on the surface of the substrate 14 of the first gas molecules 31.

Figure 2A:
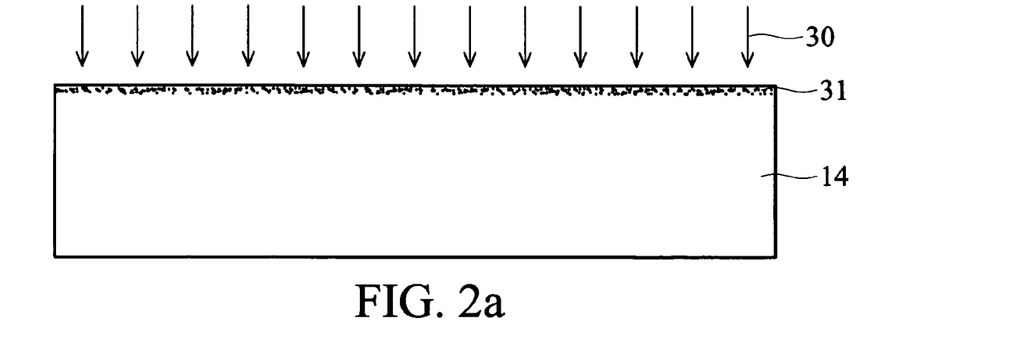
FIGS. 2a through 2c are cross-sections of the process for forming a high density dielectric film of an embodiment of the invention.

Next, the first gas flow is stopped and the first pressure of the processing chamber 26 is lowered to a second pressure, wherein the ratio between the first pressure and the second pressure can be from 2:1 to 100:1. Herein, the pressure of the processing chamber 26 can be lowered by pumping through the vacuum bump system 16.

Figure 2B:
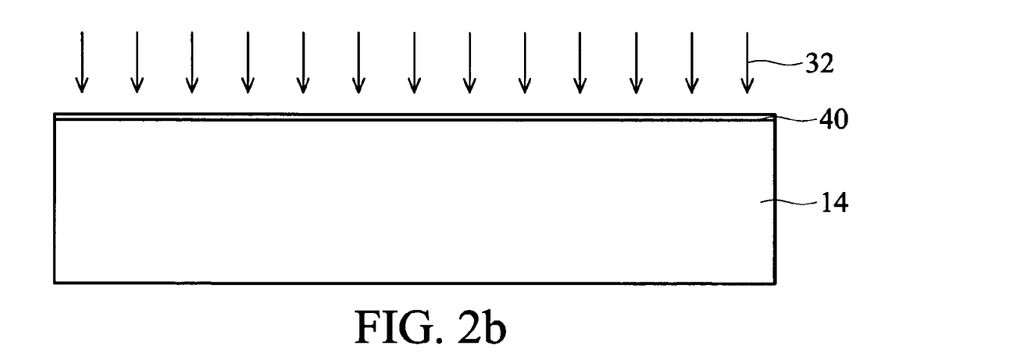

Next, a second gas flow 32 supplied by the second gas supply 20 is introduced into the processing chamber 26 with a third pressure of between 2 Torr to 0.1 mTorr, wherein the third pressure can be larger, smaller or the same, as the second pressure. Simultaneously, a plasma radio frequency (RF) power is supplied by a radio frequency power source 28, and the second gas 32 and the remaining first gas 30 are activated to generate plasma. Thus, the second gas 32 is simultaneously reacted with the first gas molecules 31 adsorbed on the surface of the substrate 14 and the first gas 30 remaining in the processing chamber 26, thereby forming a thin film 40. The radio frequency (RF) power is 5-300 watts, preferably 10-150 watts. The second gas can comprise oxidizer or reduction agent, such as N$_2$, N$_2$O, NO, NH$_3$, NF$_3$, O$_2$, H$_2$, O$_3$, CO, CO$_2$, or combinations thereof. As a main feature and a key aspect, except for chemical deposition from the second gas with the first gas adsorbed on the substrate, the thin film is also formed by ion bombardment from the plasma comprising the second gas and the first gas remaining in the processing chamber. It should be noted that the thickness of the thin film 40 can be from 5 to 20 times larger than that of a single atomic layer formed by conventional atomic layer deposition (ALD).

Figure 2C:
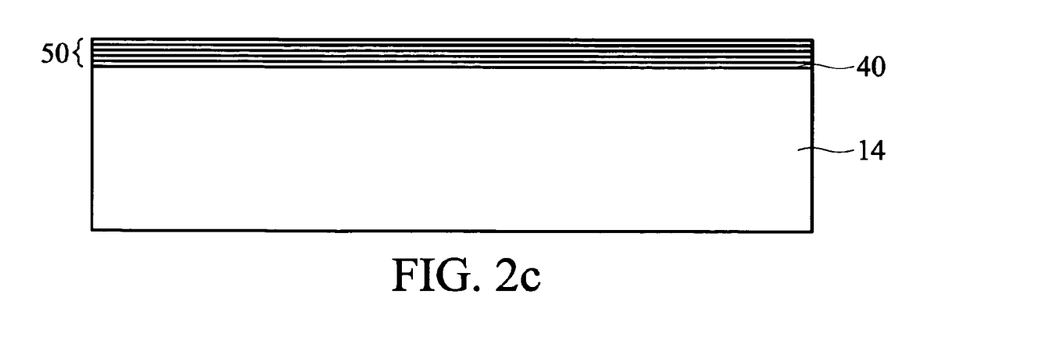

Next, the steps for forming the thin film 40 as shown in FIGS. 2a and 2b are repeated in order to form the high density dielectric film 50, comprising a plurality of the thin films 40, with a desired thickness, as depicted in FIG. 2c. Generally, the high density dielectric film 50 can have a thickness not more than 100 nm, preferably between 5 Å and 600 Å, more preferably 5 Å to 100 Å.

Figure 3:
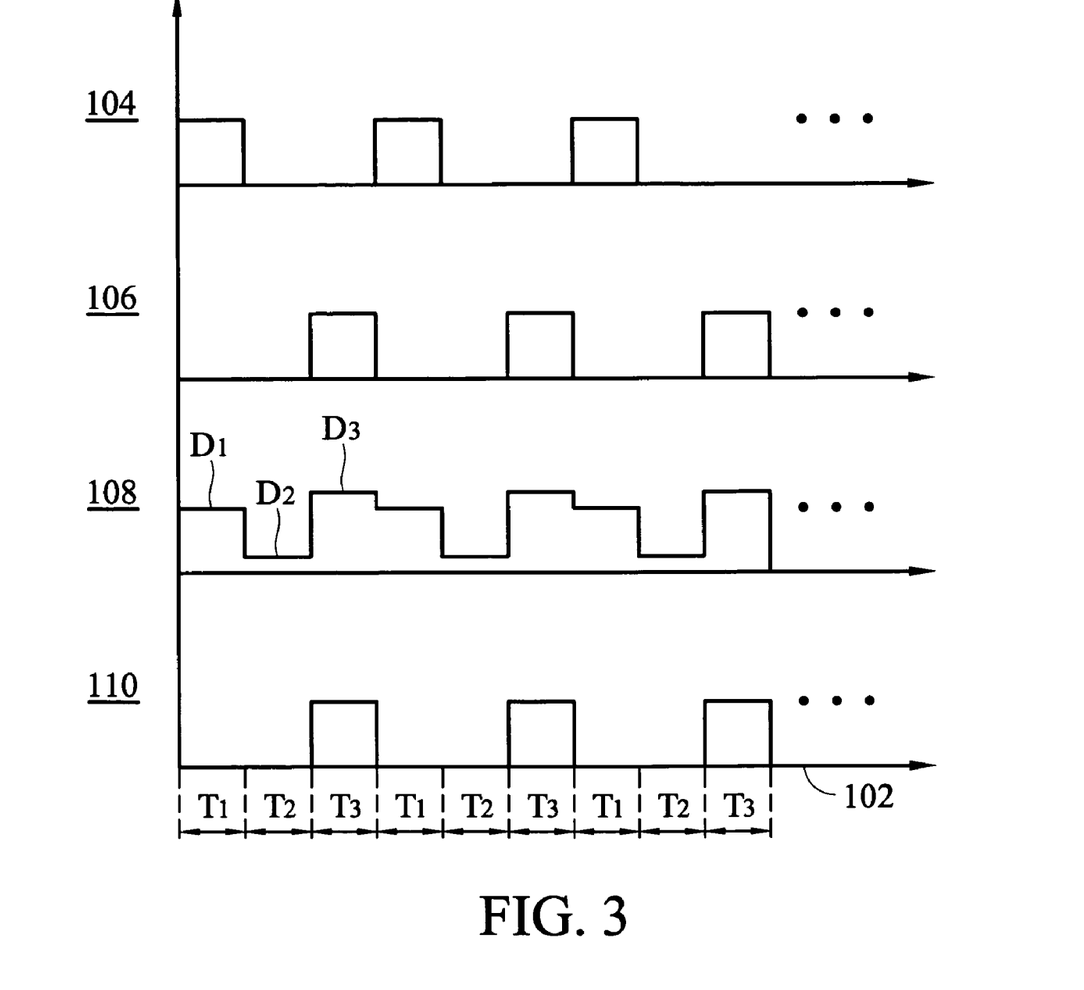
FIG. 3 is a timing diagram of the process for forming the high density dielectric film of an embodiment of the invention.

The method for forming the high density dielectric film 50 according to the described embodiment is illustrated by the timing diagram of FIG. 3. RF power 110, pressure of the processing chamber 108, supplied first gas pressure 104, and supplied second gas pressure 106 are plotted along the vertical axis and the horizontal axis represents the processing time 102. As shown in FIG. 3, the first gas 30 is supplied in the first period T$_1$, and the processing chamber 26 has the first pressure P$_1$ as same as the supplied first gas pressure. In the second period T$_2$, the first gas supply 18 is then switched off, and the processing chamber is exhausted to the second pressure P$_2$, leaving a part of the first gas 30 not adsorbed by the substrate 14. In the third period T$_3$, the second gas 32 is introduced to the processing chamber 26 with the third pressure P$_3$. Simultaneously, the RF power 110 is supplied and the second gas 32 reacts with the first gas adsorbed on the substrate 14 or remaining in the processing chamber 26. The method for forming the high density dielectric film 50 is performed by repeating the steps in the first period T$_1$, second period T$_2$, and third period T$_3$ sequentially.

Figure 4:
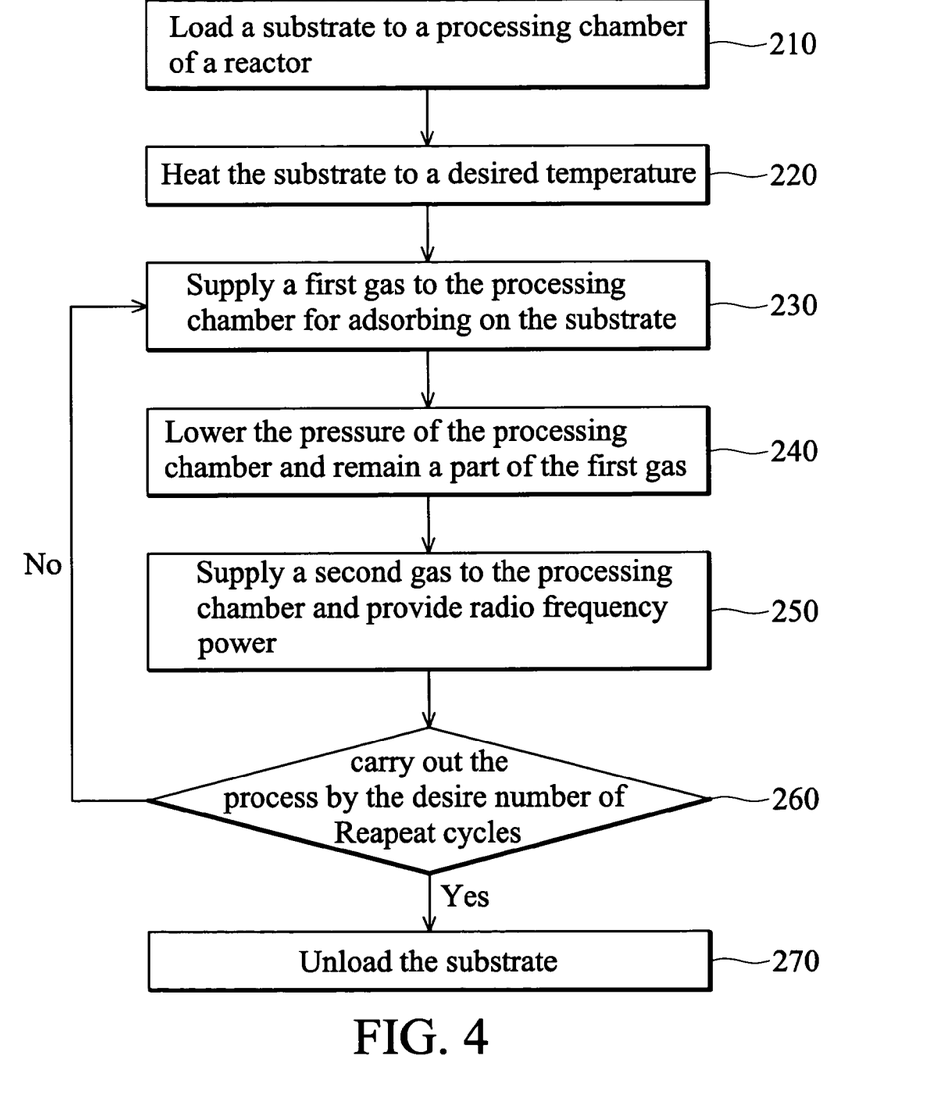
FIG. 4 is a flow diagram of a computer program that implements the method for forming the high density dielectric film of an embodiment of the invention.

FIG. 4 is a flow chart of process steps for forming the high density dielectric film 50. A substrate 14 is loaded onto a substrate holder 12 (step 210). The temperature of the substrate 14 is raised to a desired deposition temperature (step 220). A first gas 30 is supplied to a processing chamber 26 for adsorption to the substrate 14 (step 230). The pressure of the processing chamber 26 is lowered and a part of the first gas 30 which is not adsorbed to the substrate 14 remains (step 240). A second gas 32 is supplied to the processing chamber and a RF power is supplied to generate a plasma (250). The second gas 32 not only reacts with the first gas molecules 31 adsorbed on the substrate but also with the remaining first gas 30 in the processing chamber 26 and a thin film 40 is formed. The RF power is then switched off.

These process steps 230, 240, and 250 are repeated by the specified number of times until a high density dielectric film with a desired thickness is formed (step 260 and repeat of steps 230 to 260 as necessary). After deposition process is complete, the substrate 14 is unloaded from the processing chamber. (step 270).

The dielectric film fabricated by the aforementioned method has a high density of more than 3.5 g/cm$^3$ and improved adhesion with adjacent layers, suitable for serving as a capping layer for a metal layer, such as Cu layer, or a hard mask layer on a low-k dielectric layer. Additionally, due to the high density and reduced thickness, the dielectric film can substitute for the TEOS film used in thin film transistor of liquid crystal display.

Figure 5:
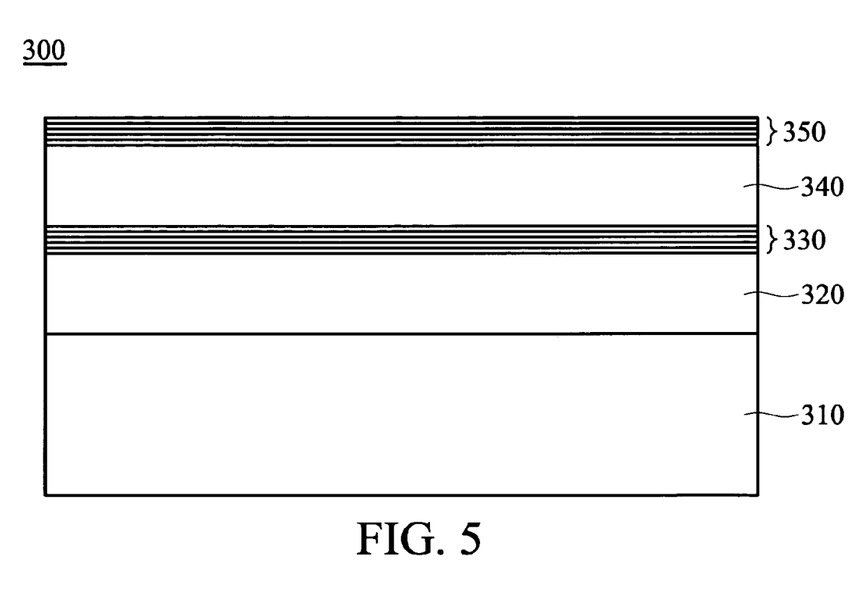
FIG. 5 is cross-section of the semiconductor device according to embodiments of the invention.

FIG. 5 illustrates a semiconductor device 300 comprising the aforementioned high density dielectric films as a cap layer and a hard mask layer, and the method for fabricated is as follows.

A substrate 310 with a conductive layer 320 thereon is loaded to a processing chamber, wherein the conductive layer can be made of Cu, Al, or alloy thereof. The substrate 310 can be heated to a desired deposition temperature of 100~400° C., preferably 150~350° C. Next, a first high density dielectric layer 330 with a thickness of 50 Å is formed on the conductive layer 320 to serve as a cap layer for the conductive layer 320. The process for forming first high density dielectric layer 330 can be performed as described, wherein the first pressure can be 1 mTorr to 1 Torr, the third pressure can be 1 mTorr to 1.2 Torr, the ratio between the first pressure and the second pressure can be 5:1 to 100:1, and a first RF power can be 10~300 watts.

Next, a low-k dielectric layer 340 with a thickness of 500~5000 nm is formed on the first high density dielectric layer 330 by PECVD. The process of the low-k dielectric layer 340 comprises the following steps. The first gas and the second gas used in the formation of the first high density dielectric layer 330 are supplied to the processing chamber with a fourth pressure, and a second RF power is supplied simultaneously. The first and second gases are activated by the second RF power generating a plasma, and the low-k dielectric layer 340 is formed by ion bombardment. The second RF power can be 300~1000 watt, the fourth pressure can be 310 Torr, and the pressure ratio between the first gas and the second gas is from 1:10 to 10:1. In some embodiments of the invention, the fourth pressure is 6 Torr, the partial pressures of the first and second gases are 3 Torr respectively, and the second RF power is 500 watt. Particularly, the low-k dielectric layer 340 is formed by a typical PECVD process. Namely, the low-k dielectric layer 340 is formed with an extremely higher deposition rate compared to that of the first high density film 330. Therefore, the ratio between the first RF power and the second RF power is from 1:2 to 1:50, preferably 1:5 to 1:50, the ratio between the first pressure and the fourth pressure is from 1:4 to 1:1000, preferably 1:20 to 1:1000, and the ratio between the third pressure and the fourth pressure is from 1:4 to 1:100, preferably 1:20 to 1:1000.

Next, a second high density dielectric layer 350 with a thickness of 50 Å is formed on the low-k dielectric layer 340 to serve as a hard mask layer. The process for forming second high density dielectric layer 330 can be the same as that for the first high density dielectric layer 330 except for substitution of the first, second, and third pressures and the first RF power for the fifth, sixth, and seventh pressure and the third RF power respectively. Wherein, the fifth pressure can be 1 mTorr to 1 Torr, the seventh pressure can be 1 mTorr to 1.2 Torr, the ratio between the fifth pressure and the sixth pressure can be 5:1 to 100:1, and the third RF power can be 10~300 watts. Further, the ratio between the third RF power and the second RF power is from 2:1 to 50:1, preferably 5:1 to 50:1, the ratio between the fifth pressure and the fourth pressure is from 1:4 to 1:1000, preferably 1:20 to 1:1000, and the ratio between the seventh pressure and the fourth pressure is from 1:4 to 1:100, preferably 1:20 to 1:1000. Herein, the reaction condition (such as pressure and RF power) of the second high density dielectric layer 350 can be the same or different, compared to that of the first high density dielectric layer 350.

Figure 6:
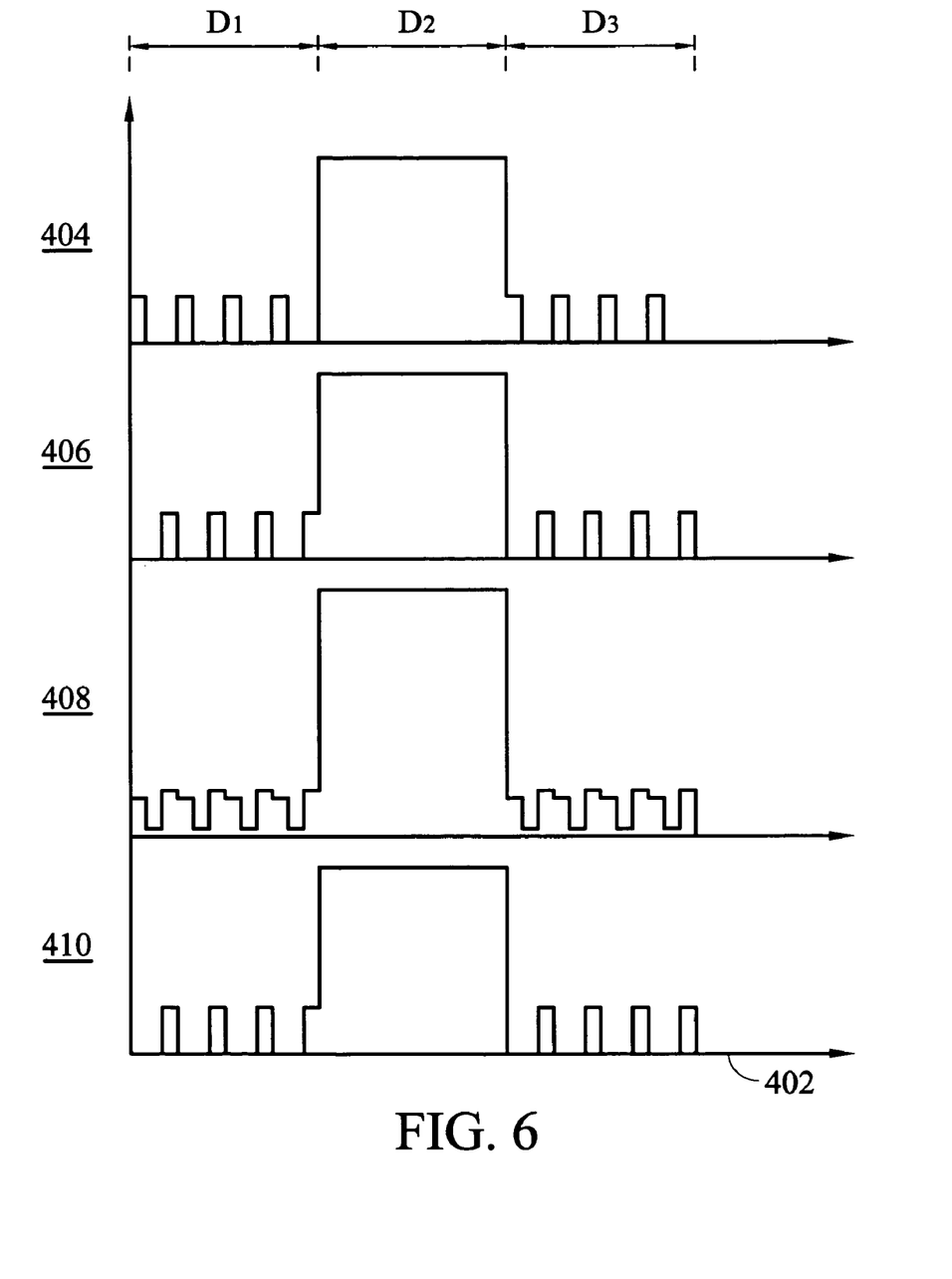
FIG. 6 is a timing diagram of the process for forming the semiconductor device according to embodiments of the invention.

The method for forming the semiconductor device 300 according to the invention is illustrated by the timing diagram of FIG. 6. RF power 410, pressure of the processing chamber 408, supplied first gas pressure 404, and supplied second gas pressure 406 are plotted along the vertical axis and the horizontal axis represents the processing time 402. The process of forming the semiconductor device 300 includes a first high density dielectric film deposition $D_1$, a low-k dielectric layer deposition $D_2$, and a second high density dielectric film deposition $D_1$. As shown in FIG. 6, the supplied first gas pressure 404, the supplied second gas pressure 406, and the RF power 410 of the low-k dielectric layer deposition $D_2$ are obviously larger than those of the first and second high density dielectric film depositions $D_1$ and $D_3$. Further, the low-k dielectric layer deposition $D_2$ employs a continuous RF power, a continuous first gas flow and a continuous second gas flow. The first and second high density dielectric film depositions $D_1$ and $D_3$ employ a pulsed RF power, a pulsed first gas flow and a pulsed second gas flow. As a result, the depositions $D_1$ and $D_3$ have a lower deposition rate and a higher dielectric density than those of the deposition $D_2$. It should also be noted that the depositions $D_1$ and $D_3$ can be performed in the same processing chamber as the deposition $D_2$. Moreover, the depositions $D_1$ and $D_3$ may be performed in different chamber than deposition $D_2$.

Figure 7:
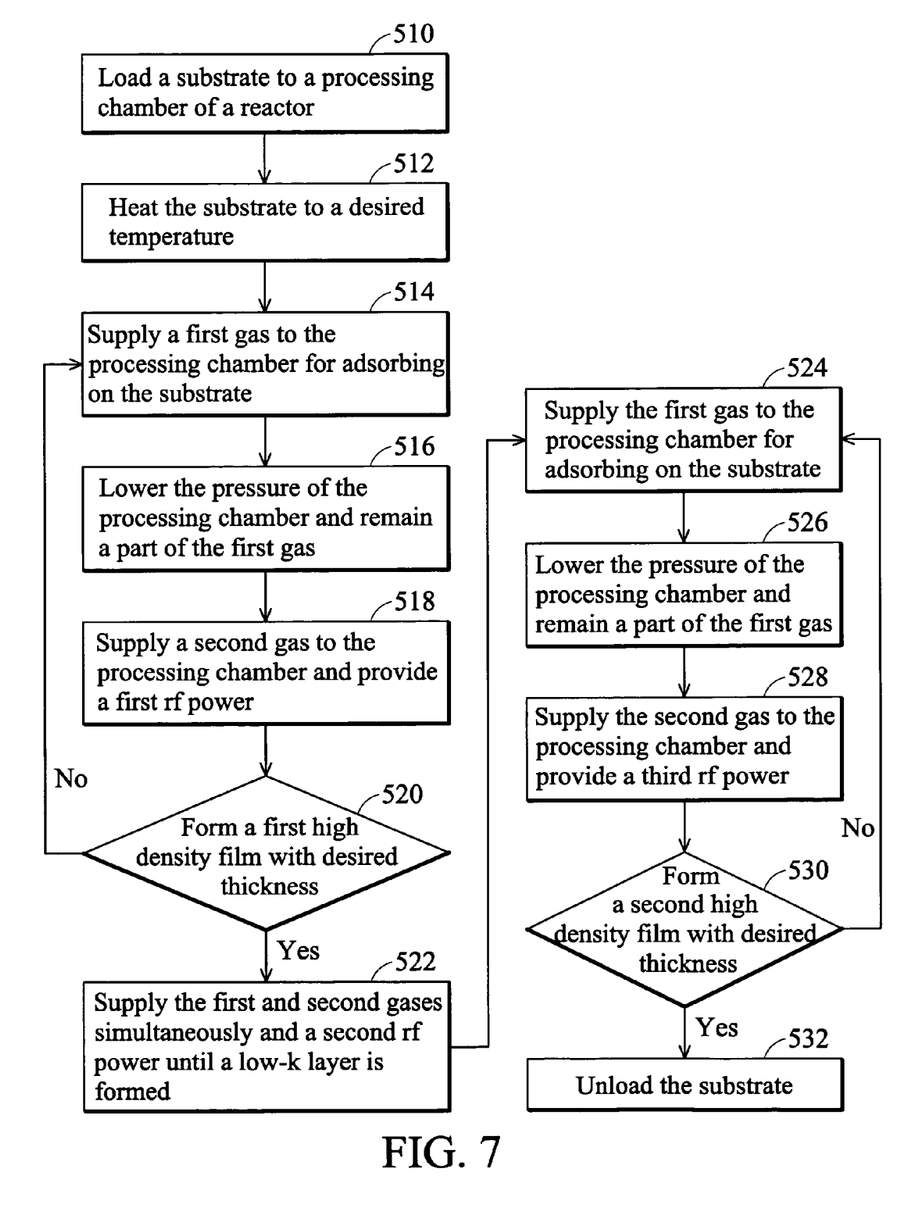
FIG. 7 is a flow diagram of a computer program that implements the method for forming the semiconductor device according to embodiments of the invention.

FIG. 7 is a flow chart of process steps for forming the semiconductor device 300 according to embodiments of the invention. A substrate with a conductive layer thereon is loaded into a processing chamber (step 510). The temperature of the substrate is raised to a desired deposition temperature (step 512). A first gas is supplied to the processing chamber (step 514). The pressure of the processing chamber is lowered and a part of the first gas which is not adsorbed to the substrate remains (step 516). A second gas is supplied to the processing chamber and a RF power is supplied to generate a plasma (step 518). These process steps 514, 516, and 518 are repeated until the first high density dielectric film is formed (step 520 and repeat of steps 514 to 518 as necessary). The first and second gases are supplied continuously to the processing chamber and the second RF power is supplied continuously to form the low-k dielectric layer (step 522). Process steps 524, 526, 528, and 530, which are similar to the process steps 514, 516, 518, and 520, are performed to form the second high density dielectric film. Once the deposition processes are complete, the substrate is unloaded from the processing chamber (step 532).

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a high density dielectric film by chemical vapor deposition, comprising:
   (a) providing a substrate in a processing chamber;
   (b) flowing a first gas at a first pressure to adsorb on the substrate, wherein the first gas comprises silicon-containing or carbon-containing gas;
   (c) halting the flow of the first gas and lowering the first pressure to a second pressure;
   (d) flowing a second gas to a third pressure to react with the first gas adsorbed on the substrate for chemical deposition and simultaneously generating a plasma comprising the second gas reacting with the first gas remaining in the processing chamber by ion bombardment, wherein the second gas comprises oxidizer or reduction agent; and (e) repeating steps (b)~(d) to form a high density dielectric film on the substrate.

2. The method as claimed in claim 1, wherein a method for reacting the second gas with the first gas in the step (d) comprises generating a plasma by a radio frequency (RF) power of 5~300 watts.

3. The method as claimed in claim 1, wherein the high density dielectric film has a thickness of no more than 100 nm.

4. The method as claimed in claim 1, wherein the steps (b)~(d) are performed at a temperature of 100~400° C.

5. The method as claimed in claim 1, wherein the steps (b)~(d) are performed at a temperature of 150~350° C.

6. The method as claimed in claim 1, wherein the first pressure is not more than 3 Torr.

7. The method as claimed in claim 1, wherein the first pressure is between 1 Torr to 0.1 mTorr.

8. The method as claimed in claim 1, wherein the ratio between the first pressure and the second pressure is from 2:1 to 100:1.

9. The method as claimed in claim 1, wherein the third pressure is between 2 Torr to 0.1 mTorr.

10. The method as claimed in claim 1, wherein the first gas comprises $SiH_4$, $Si_2H_6$, $SiH_3CH_3$, TEOS, TMCTS, OMCTS, methyl-silane, dimethyl-silane, 3MS, 4MS, TMDSO, TMDDSO, DMDMS or combinations thereof.

11. The method as claimed in claim 1, wherein the second gas comprises $N_2$, $N_2O$, NO, $NH_3$, $NF_3$, $O_2$, $H_2$, $O_3$, CO, $CO_2$, or combinations thereof.

12. A method for fabricating a semiconductor device, comprising:

(a) providing a substrate in a processing chamber;

(b) flowing a first gas to a first pressure to adsorb on the substrate, wherein the first gas comprises silicon-containing or carbon-containing gas;

(c) halting the flow of the first gas and lowering the first pressure to a second pressure;

(d) flowing a second gas to a third pressure to react with the first gas adsorbed on the substrate for chemical deposition and simultaneously generating a plasma comprising the second gas reacting with the first gas remaining in the processing chamber by ion bombardment, wherein the second gas comprises oxidizer or reduction agent; and (e) repeating steps (b)~(d) to form a first high density dielectric film on the substrate; and (f) simultaneously flowing the first gas and second gas to a fourth pressure of more than 3 Torr, and reacting the first gas and the second gas to form a low-k dielectric layer on the first high density dielectric film.

13. The method as claimed in claim 12, wherein a method for reacting the second gas with the first gas in the step (d) comprises generating a plasma by a first radio frequency (RF) power.

14. The method as claimed in claim 12, wherein the ratio between the first pressure and the second pressure is from 2:1 to 100:1.

15. The method as claimed in claim 12, wherein the ratio between the first pressure and the fourth pressure is from 1:4 to 1:1000.

16. The method as claimed in claim 12, wherein the ratio between the third pressure and the fourth pressure is from 1:4 to 1:1000.

17. The method as claimed in claim 12, wherein the pressure ratio between the first gas and the second gas is from 1:10 to 10:1.

18. The method as claimed in claim 13, wherein a method for reacting the first gas with the second gas in the step (f) comprises generating a plasma by a second radio frequency (RF) power.

19. The method as claimed in claim 18, wherein the ratio between the second RF power is 300~1000 watts.

20. The method as claimed in claim 18, wherein the ratio between the first RF power and the second RF power is from 2:1 to 50:1.

21. The method as claimed in claim 18, after the step (f), further comprising:

(g) flowing the first gas to a fifth pressure to adsorb on the low-k dielectric layer;

(h) halting the flow of the first gas and lowering the fifth pressure to a sixth pressure;

(i) flowing the second gas to a seventh pressure and reacting the second gas with the first gas; and (j) repeating steps (g)~(i) to form a second high density dielectric film on the low-k dielectric layer.

22. The method as claimed in claim 21, wherein a method for reacting the second gas with the first gas in the step (i) comprises generating a plasma by a third radio frequency (RF) power.

23. The method as claimed in claim 21, wherein the ratio between the fifth pressure and the sixth pressure is from 2:1 to 100:1.

24. The method as claimed in claim 21, wherein the ratio between the fifth pressure and the fourth pressure is from 1:4 to 1:1000.

25. The method as claimed in claim 21, wherein the ratio between the seventh pressure and the fourth pressure is from 1:4 to 1:1000.

26. The method as claimed in claim 21, wherein the steps (d), (f), and (i) are performed in the same process chamber.

27. The method as claimed in claim 22, wherein the ratio between the third RF power and the second RF power is from 2:1 to 50:1.

* * * * *